United States Patent
Hayakawa et al.

(10) Patent No.: US 9,455,639 B2
(45) Date of Patent: Sep. 27, 2016

(54) SWITCHED-MODE POWER SUPPLY DEVICE

(71) Applicant: SANKEN ELECTRIC CO., LTD., Niiza-Shi, Saitama (JP)

(72) Inventors: Akira Hayakawa, Fujimino (JP); Masaaki Shimada, Fujimi (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 14/739,264

(22) Filed: Jun. 15, 2015

(65) Prior Publication Data

US 2015/0381056 A1 Dec. 31, 2015

(30) Foreign Application Priority Data

Jun. 27, 2014 (JP) ................................. 2014-132450
Mar. 26, 2015 (JP) ................................. 2015-063711

(51) Int. Cl.
*H02M 3/335* (2006.01)
*H02M 1/44* (2007.01)
*H03K 17/16* (2006.01)
*H02M 1/00* (2006.01)

(52) U.S. Cl.
CPC ........... *H02M 3/33507* (2013.01); *H02M 1/44* (2013.01); *H03K 17/164* (2013.01); *H02M 2001/0029* (2013.01); *H02M 2001/0032* (2013.01); *Y02B 70/16* (2013.01)

(58) Field of Classification Search
CPC .......... H02M 3/335; H02M 3/33507; H02M 3/33523; H02M 2001/0032; H02M 2001/0029
See application file for complete search history.

(56) References Cited

U.S. PATENT DOCUMENTS

| | | | | |
|---|---|---|---|---|
| 4,956,761 A * | 9/1990 | Higashi | ............. | H02M 3/33523 323/222 |
| 6,546,205 B1 * | 4/2003 | Yamaguchi | ............ | H05B 41/32 396/205 |
| 7,760,520 B2 * | 7/2010 | Jang | ........................ | H02M 1/32 363/21.18 |
| 8,693,216 B2 * | 4/2014 | Moon | ..................... | H02M 1/36 323/901 |
| 2001/0007530 A1 * | 7/2001 | Hosotani | ........... | H02M 3/33569 363/20 |
| 2002/0101742 A1 * | 8/2002 | Hosotani | ............. | H02M 3/3382 363/17 |
| 2005/0018458 A1 * | 1/2005 | Shimada | ............. | H02M 1/4225 363/125 |
| 2007/0145956 A1 * | 6/2007 | Takeuchi | ............ | H02M 1/4225 323/207 |
| 2007/0291516 A1 * | 12/2007 | Nakamura | ............... | H02M 1/32 363/21.01 |
| 2008/0175027 A1 * | 7/2008 | Shimada | ........... | H02M 3/33569 363/49 |
| 2009/0116265 A1 * | 5/2009 | Saji | ................... | H02M 3/33507 363/37 |
| 2010/0039835 A1 * | 2/2010 | Shimada | ........... | H02M 3/33507 363/21.12 |
| 2010/0053998 A1 * | 3/2010 | Shimada | ........... | H02M 3/33507 363/21.01 |

(Continued)

FOREIGN PATENT DOCUMENTS

JP 2011-166920 A 8/2011

*Primary Examiner* — Matthew Nguyen
*Assistant Examiner* — Yusef Ahmed
(74) *Attorney, Agent, or Firm* — Mots Law, PLLC

(57) ABSTRACT

A switched-mode power supply device is disclosed including an AC power supply, a transformer including a primary winding and a secondary winding, a switching element electrically connected to the primary winding, a secondary-side rectifying and smoothing circuit that generates an output voltage by rectifying and smoothing the pulse voltage, a load ratio detection circuit that detects if a load ratio is not greater than a load ratio threshold value during steady load, and outputs a drive switch signal based on the detection, and a drive circuit that, on the basis of the drive switch signal, causes the switching element to perform switching operation in one of a normal drive in which a speed of charging a gate voltage is faster and a soft drive in which the speed of charging the gate voltage is slower.

9 Claims, 10 Drawing Sheets

(56) References Cited

U.S. PATENT DOCUMENTS

| | | | | |
|---|---|---|---|---|
| 2010/0208500 A1* | 8/2010 | Yan | H02M 3/33523 | 363/21.12 |
| 2012/0243272 A1* | 9/2012 | Shimada | H02M 3/33507 | 363/21.15 |
| 2013/0343097 A1* | 12/2013 | Chen | H02M 3/33515 | 363/21.02 |
| 2014/0268950 A1* | 9/2014 | Medina-Garcia | H02M 3/33507 | 363/78 |
| 2014/0347895 A1* | 11/2014 | Tadamasa | H02M 3/33507 | 363/21.16 |
| 2014/0362609 A1* | 12/2014 | Bisschop | H02M 3/33523 | 363/21.12 |
| 2015/0117072 A1* | 4/2015 | Jao | H02M 1/36 | 363/21.17 |
| 2015/0249380 A1* | 9/2015 | Hayakawa | H02M 3/33523 | 363/21.16 |
| 2015/0280585 A1* | 10/2015 | Hayakawa | H02M 3/33515 | 363/21.13 |

* cited by examiner

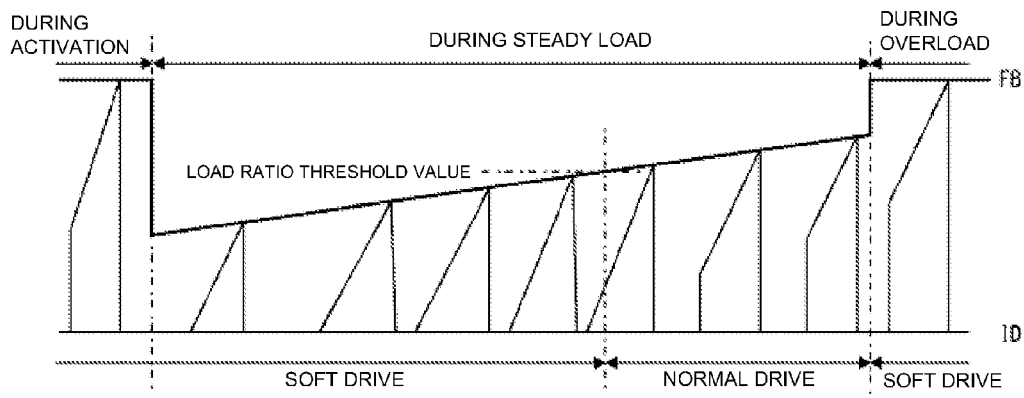

SWITCHED-MODE POWER SUPPLY DEVICE

CROSS REFERENCE TO RELATED APPLICATIONS

This application claims priority based on 35 USC 119 from prior Japanese Patent Applications No. 2014-132450 filed on Jun. 27, 2014, entitled "SWITCHED-MODE POWER SUPPLY DEVICE", and No. 2015-063711 filed on Mar. 26, 2015, entitled "SWITCHED-MODE POWER SUPPLY DEVICE", the entire contents of which are hereby incorporated by reference.

BACKGROUND

The invention relates to a switched-mode power supply device configured to control an output voltage by switching operation.

In a technique proposed for a power converter, EMI (Electro-Magnetic Interference) noise is reduced by increasing a gate resistance at certain timing determined based on: a result of comparing a pulse width of a generated control pulse and a predetermined pulse width threshold value; and a result of comparing information on estimated device temperature and a predetermined temperature threshold value (see Japanese Patent Application Publication No. 2011-166920 (Patent Document 1), for example).

SUMMARY

A switched-mode power supply device of an embodiment comprises that an AC power supply; a transformer comprising a primary winding to which a DC voltage is applied, the DC voltage generated by rectifying an input voltage from the AC power supply, and a secondary winding that induces a pulse voltage based on operation of a switching element; the switching element electrically connected to the primary winding; a secondary-side rectifying and smoothing circuit that generates an output voltage by rectifying and smoothing the pulse voltage; a load ratio detection circuit that detects if a load ratio is not greater than a load ratio threshold value during steady load, and outputs a drive switch signal based on the detection; and a drive circuit that, on the basis of the drive switch signal, causes the switching element to perform switching operation in one of a normal drive in which a speed of charging a gate voltage is faster and a soft drive in which the speed of charging the gate voltage is slower.

A switched-mode power supply device of another embodiment comprises an AC power supply; a transformer comprising a primary winding to which a DC voltage is applied, the DC voltage generated by rectifying an input voltage from the AC power supply, and a secondary winding that induces a pulse voltage based on operation of a switching element; the switching element electrically connected to the primary winding; a secondary-side rectifying and smoothing circuit that generates an output voltage by rectifying and smoothing the pulse voltage; a drive circuit that, on the basis of a drive switch signal, cause the switching element to perform switching operation in one of a normal drive in which a speed of charging a gate voltage is faster and a soft drive in which the speed of charging the gate voltage is slower; and a drive switch circuit that outputs the drive switch signal for instructing the soft drive if an ON duty of the switching element is less than a pre-set duty threshold value, and outputs the drive switch signal for instructing the normal drive if the ON duty of the switching element is equal to or greater than the duty threshold value.

BRIEF DESCRIPTION OF DRAWINGS

FIG. 5 is a waveform diagram for explaining how drive operation is performed in accordance with a load ratio.

FIGS. 6A, 6B and 6C are diagrams for explaining how drive switch timing is set in accordance with the load ratio.

DETAILED DESCRIPTION

Figure 1:
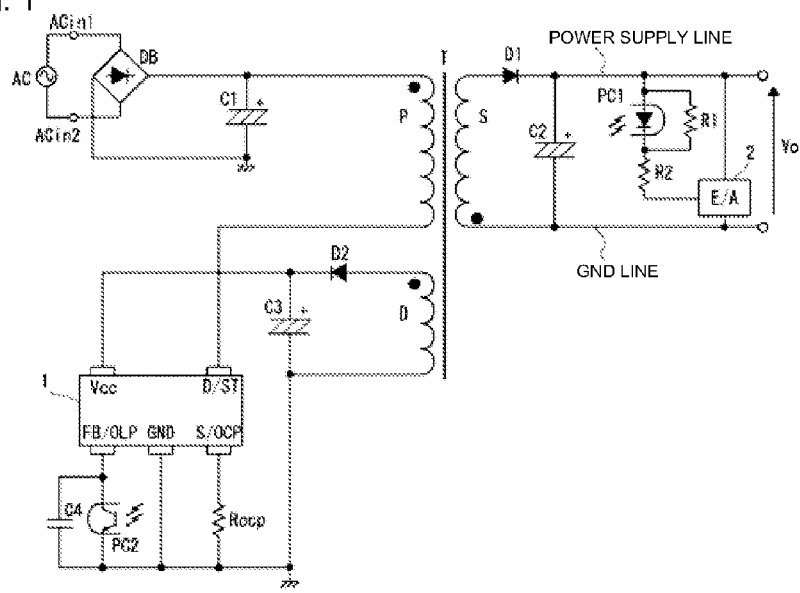
FIG. 1 illustrates a circuit configuration of a first embodiment of a switched-mode power supply device.

Next, referring to the drawings, concrete descriptions are provided for embodiments. It should be noted that: throughout the drawings, the same components are denoted by the same reference signs; and part of the descriptions for such components is omitted.

(First Embodiment)

Referring to FIG. 1, a switched-mode power supply device of a first embodiment includes: rectifier circuit DB; smoothing capacitors C1, C2, C3; transformer T; controller IC 1; rectifier diodes D1, D2; error amplifier (E/A) 2; light-emitting diode PC1 and light-receiving transistor PC2 which form a photo-coupler; current sensing resistor Rocp; resistors R1, R2; and capacitor C4.

Commercial AC power supply AC is connected to AC input terminals ACin1, ACin2 of rectifier circuit DB in which a diode bridge is built. As an input voltage, an AC voltage is inputted into rectifier circuit DB from commercial AC power supply AC. Rectifier circuit DB performs full-wave rectification on the AC voltage, and outputs the resultant voltage. Smoothing capacitor C1 is connected between a rectified output positive terminal and a rectified output negative terminal of rectifier circuit DB. In addition, the rectified output negative terminal of rectifier circuit DB is connected to a ground terminal. This makes it possible to obtain a DC power supply which is generated by rectifying and smoothing commercial AC power supply AC using rectifier circuit DB and smoothing capacitor C1.

A switching element such as a power MOSFET (Metal Oxide Semiconductor Field Effect Transistor), and a control circuit configured to control the switching of the switching element are built in controller IC 1. Controller IC 1 includes a D/ST (MOSFET drain/activation current input) terminal, an S/OCP (MOSFET source/overcurrent protection) terminal, a Vcc (control circuit power supply voltage input) terminal, an FB/OLP (feedback signal input/overload protection signal input) terminal, and a GND terminal.

Transformer T configured to supply electric power from a primary side (an input side) to a secondary side (a load side) includes primary winding P, auxiliary winding D and secondary winding S. The rectified output positive terminal of rectifier circuit DB is connected to one end portion of primary winding P of transformer T, while the opposite end portion of primary winding P of transformer T is connected to the D/ST terminal of controller IC 1. The S/OCP terminal of controller IC 1 is connected to the ground terminal via resistor Rocp. Thereby, the electric power given to primary winding P of transformer T is transmitted to secondary winding S of transformer T by ON/OFF control of the switching element built in controller IC 1. As a result, a pulse voltage is generated in secondary winding S of transformer T. Furthermore, current sensing resistor Rocp is connected as a resistor configured to sense a current, which flows in the switching element built in controller IC 1, as voltage signal $V_{ocp}$. Controller IC 1 has an overcurrent protection (OCP) function of stopping the supply of the electric power to the secondary side once voltage signal $V_{ocp}$ corresponding to the current flowing in the switching element becomes equal to or greater than a pre-set overcurrent threshold value.

Smoothing capacitor C2 is connected between the two terminals of secondary winding S of transformer T via rectifier diode D1. The voltage induced in secondary winding S of transformer T is rectified by rectifier diode D1, and is smoothed by smoothing capacitor C2. As output voltage Vo, an inter-terminal voltage of smoothing capacitor C2 is outputted from the output terminals of transformer T. Incidentally, a line connected to a positive terminal of smoothing capacitor C2 is a power supply line, while a line connected to a negative terminal of smoothing capacitor C2 is a GND line connected to the ground terminal.

Error amplifier 2 is connected in series between the power supply line and the GND line. Connected between the power supply line and the GND line, error amplifier 2 controls a current flowing to light-emitting diode PC1 in the photocoupler, based on a difference between output voltage Vo and a reference voltage stored in error amplifier 2. In addition, the FB/OLP terminal of controller IC 1 is connected to the ground terminal via light-receiving transistor PC2 and capacitor C4, which are connected together in parallel. Thereby, a feedback (FB) signal according to the output voltage is sent from light-emitting diode PC1 on the secondary side to light-receiving transistor PC2 on the primary side, and as voltage signal $V_{FB}$, is inputted into the FB/OLP terminal of controller IC 1. Based on voltage signal $V_{FB}$ inputted into the FB/OLP terminal, controller IC 1 controls a duty ratio of the switching element, and thereby controls electric energy to be supplied to the secondary side.

In addition, smoothing capacitor C3 is connected between the two terminals of auxiliary winding D of transformer T via rectifier diode D2, and a connection point between rectifier diode D2 and smoothing capacitor C3 is connected to the Vcc terminal of controller IC 1. Thereby, a voltage generated in auxiliary winding D is rectified by rectifier diode D2, and is smoothed by smoothing capacitor C3. As IC power supply voltage Vcc, the resultant voltage is supplied to the Vcc terminal of controller IC 1.

Figure 2:
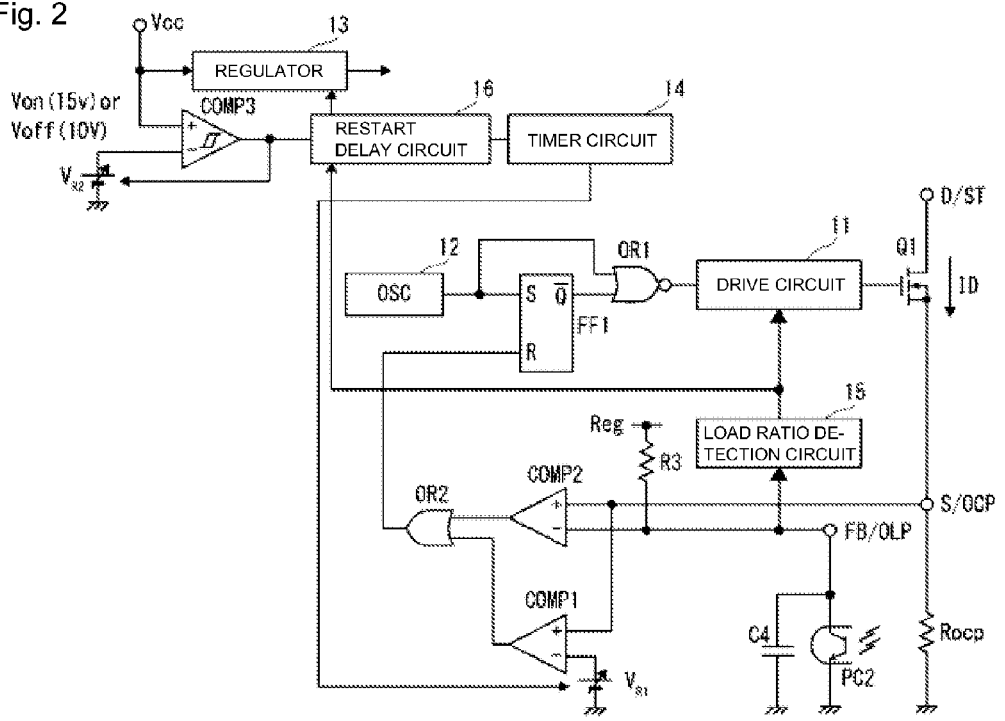
FIG. 2 illustrates a circuit configuration of a controller IC illustrated in FIG. 1.

Next, referring to FIG. 2, descriptions are provided for a circuit configuration of the first embodiment of controller IC 1 illustrated in FIG. 1.

Referring to FIG. 2, controller IC 1 includes switching element Q1 formed from an N-channel power MOSFET and the like, drive circuit 11, OSC (internal oscillator) 12, regulator 13, timer circuit 14, load ratio detection circuit 15, restart delay circuit 16, variable voltages $V_{R1}$, $V_{R2}$, OR circuits OR1, OR2, flip flop FF1, comparators COMP1, COMP2, COMP3, and resistor R3.

The drain terminal of switching element Q1 is connected to the D/ST terminal, while the source terminal of switching element Q1 is connected to the S/OCP terminal. Drive circuit 11 configured to control ON and OFF of switching element Q1 by outputting drive signal DRV for driving switching element Q1 is connected to the gate terminal of switching element Q1. Output from OR circuit OR1 is inputted into drive circuit 11.

Output from OSC 12 and output from inverting output terminal Q⁻ of flip-flop FF1 are inputted into the input terminals of OR circuit OR1, respectively. The output of OSC 12 is connected to the S terminal of flip-flop FF1, while the output of OR circuit OR2 is connected to the R terminal of flips flop FF1. It should be noted that the pulse width of a clock signal outputted from OSC 12 is set less than a minimum ON time width of switching element Q1. Flip flop FF1 functions as a PWM latch circuit. Thereby, if the output signal from OSC 12 is at the low level (if no clock signal is outputted from OSC 12), and if flip flop FF1 is set so that the output signal from inverting output terminal Q⁻ is at the low level, a high-level output signal is inputted into drive circuit 11 from the inverting output terminal of OR circuit OR1, and switching element Q1 is thus turned on.

The S/OCP terminal is connected to the non-inverting terminal of comparator COMP1 and the non-inverting terminal of comparator COMP2. Comparator COMP1 is an OCP comparator configured to detect an overcurrent. Variable voltage $V_{R1}$, which is set at the overcurrent threshold value while in normal drive is connected to the inverting terminal of comparator COMP1. While in normal drive, if voltage signal $V_{ocp}$ at the S/OCP terminal which corresponds to drain current ID flowing in switching element Q1 is equal to or greater than the overcurrent threshold value, comparator COMP1, outputs a high-level output signal. Once the output signal from comparator COMP1 turns to the high-level, flip flop FF1 is reset via OR circuit OR2, and an output signal from OR circuit OR1 turns to the low level. Accordingly, switching element Q1 is turned off.

Comparator COMP2 is a current sensing converter configured to perform feedback control for controlling the duty ratio of switching element Q1 based on an FB signal which as voltage signal $V_{FB}$, is inputted into the FB/OLP terminal. The inverting input terminal of comparator COMP2 is connected to the FB/OLP terminal, which is connected to reference voltage Reg via resistor R3. Comparator COMP2 compares voltage signal $V_{ocp}$ and voltage signal $V_{FB}$. If voltage signal $V_{ocp}$ is equal to or greater than voltage signal $V_{FB}$, comparator COMP2 outputs the high-level output signal. Once the output signal from comparator COMP2 turns to the high level, flip flop FF1 is reset via OR circuit OR2, and the output signal from OR circuit OR1 turns to the low level. Accordingly, switching element Q1 is turned off. Thereby, comparator COMP2 performs the feedback control for controlling the duty ratio of switching element Q1 based on the FB signal.

Comparator COMP3 is a comparator circuit configured to compare IC power supply voltage Vcc at the Vcc terminal and variable voltage $V_{R2}$. The non-inverting input terminal of comparator COMP3 is connected to the Vcc terminal, while the inverting input terminal of comparator COMP3 is connected to variable voltage $V_{R2}$. An output signal from comparator COMP3 is inputted into variable voltage $V_{R2}$. Variable voltage $V_{R2}$ is set at first reference voltage Von (for example, 15 V), if an output signal from UVLO circuit COMP3 is at the low level. Variable voltage $V_{R2}$ is set at second reference voltage Voff (for example, 10 V) that is lower than first reference voltage Von, if the output signal from UVLO circuit COMP3 is at the high level. Thereby, the output signal from comparator COMP3 has a hysteresis characteristic. Once IC power supply voltage Vcc exceeds first reference voltage Von as a result of the charging of smoothing capacitor C3, illustrated in FIG. 1, by an activation circuit, albeit not illustrated, the output signal from comparator COMP3 turns to the high level. Once IC power supply voltage Vcc becomes equal to or less than second reference voltage Voff, the output signal from comparator COMP3 turns to the low level.

Furthermore, the output terminal of comparator COMP3 is connected to regulator 13 via restart delay circuit 16. Regulator 13 receives the supply of electric power from the Vcc terminal. If the output signal from comparator COMP3 turns to the high level, regulator 13 turns into operation, and supplies the power supply voltage for activating the parts of controller IC 1. In other words, the output signal from comparator COMP3 is a signal for controlling the ON and OFF of controller IC 1. While controller IC 1 is in steady operation (while its switching operation is ON), the output signal from UVLO circuit COMP1 turns to the high level. For this reason, first reference voltage Von of variable voltage $V_{R2}$ is an operation start voltage for controller IC 1, while second reference voltage Voff of variable voltage $V_{R2}$ is an operation stop voltage for controller IC 1.

In addition, the output terminal of comparator COMP3 is connected to timer circuit 14 via restart delay circuit 16. Timer circuit 14 detects the start of activation at timing when the output from comparator COMP3 turns to the high level. Moreover, timer circuit 14 performs soft-start control for gradually raising variable voltage $V_{R1}$ to the overcurrent threshold value over a pre-set length of time starting at the start of the activation.

Figure 3:
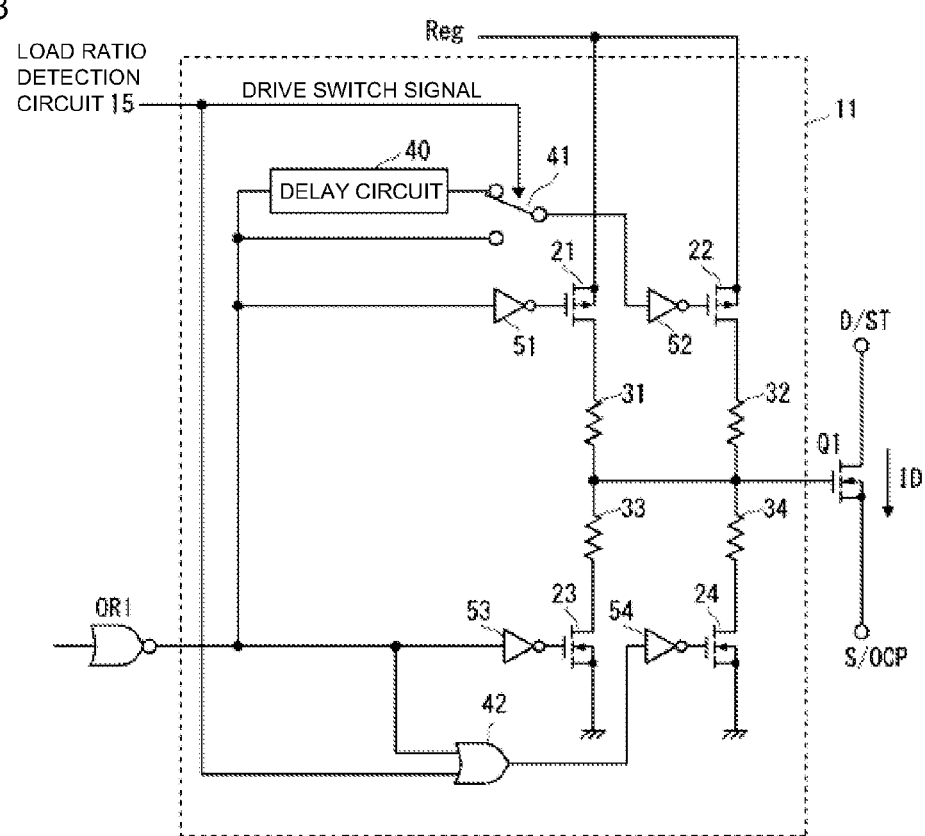
FIG. 3 illustrates a circuit configuration of a drive circuit illustrated in FIG. 2.

Drive circuit 11 outputs the drive signal for driving switching element Q1 based on the output signal from OR circuit OR1. Referring to FIG. 3, drive circuit 11 includes: first on-switch element 21 formed from a P-channel MOSFET; second on-switch element 22 formed from a P-channel MOSFET; first on-drive resistor 31; second on-drive resistor 32; first off-switch element 23 formed from an N-channel MOSFET; second off-switch element 24 formed from an N-channel MOSFET; first off-drive resistor 33; second off-drive resistor 34; delay circuit 40; selector switch 41; OR circuit 42; and inverters 51, 52, 53, 54.

First on-switch element 21 and first on-drive resistor 31 connected together in series, as well as second on-switch element 22 and second on-drive resistor 32 connected together in series are connected in parallel between power supply voltage Reg and the gate of switching element Q1. Furthermore, the output terminal of OR circuit OR1 is connected to the gate of first on-switch element 21 via inverter 51, while the output terminal of selector switch 41 is connected to the gate of second on-switch element 22 via inverter 52. The output terminal of OR circuit OR1 is directly connected to one input terminal of selector switch 41, while the output terminal of OR circuit OR1 is connected to the other input terminal of selector switch 41 via delay circuit 40. In addition, first off-drive resistor 33 and first off-switch element 23 connected together in series, as well as second off-drive resistor 34 and second off-switch element 24 connected together in series are connected in parallel between the gate of switching element Q1 and the GND terminal. Moreover, the output terminal of OR circuit OR1 is connected to the gate of first off-switch element 23 via inverter 53, while the output terminal of OR circuit 42 is connected to the gate of second off-switch element 24 via inverter 54. The output terminal of OR circuit OR1 is connected to one input terminal of OR circuit 42. The output terminal of load ratio detection circuit 15 is connected to the other input terminal of OR circuit 42, and a drive switch signal is inputted into the input terminal of OR circuit 42. Selector switch 41 is controlled by the drive switch signal from load ratio detection circuit 15. When the drive switch signal turns to the low level, selector switch 41 is switched to the one input terminal to which the output terminal of OR circuit OR1 is directly connected. When the drive switch signal turns to the high level, selector switch 41 is switched to the other input terminal to which the output terminal of OR circuit OR1 is connected via delay circuit 40.

Figure 4A:
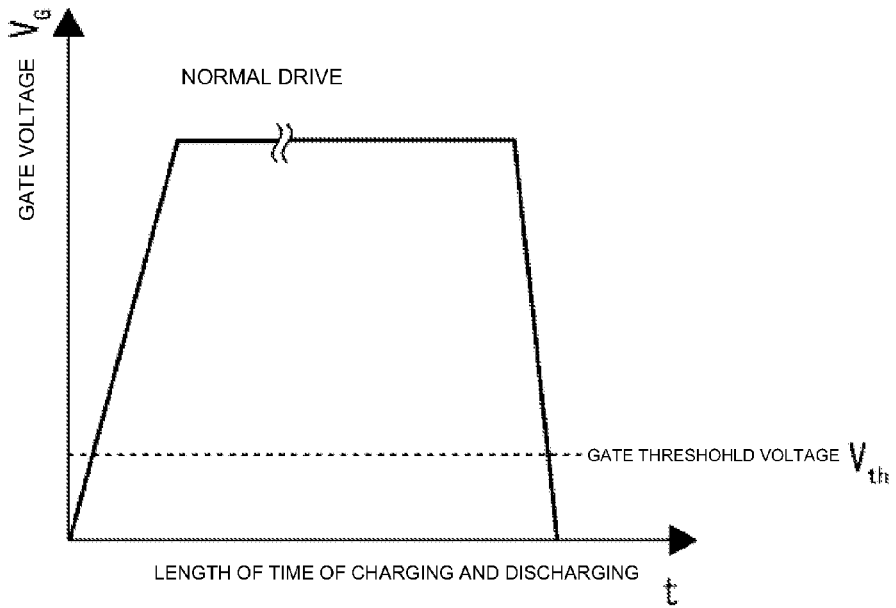
FIGS. 4A and 4B illustrate a speed of charging and discharging a gate of a switching element, illustrated in FIG. 2, for a normal drive and a soft drive.

While normal drive is instructed by the low-level drive switch signal, once the output signal from OR circuit OR1 turns to the high level, both first on-switch element 21 and second on-switch element 22 are turned on, first off-switch element 23 is turned off, and output from OR circuit 42 turns to the high level. Thus, second off-switch element 24 is turned off, too. Thereby, as illustrated in FIG. 4A, the gate of switching element Q1 is charged via first on-drive resistor 31 and second on-drive resistor 32 which are connected together in parallel.

While the normal drive is instructed by the low-level drive switch signal, once the output signal from OR circuit OR1 turns to the low level, both first on-switch element 21 and second on-switch element 22 are turned off, first off-switch element 23 is turned on, and the output from OR circuit 42 turns to the low level. Thus, second off-switch element 24 is turned on, too. Thereby, as illustrated in FIG. 4A, the electric charge put into the gate of switching element Q1 is discharged via first off-drive resistor 33 and second off-drive resistor 34 which are connected together in parallel.

Figure 4B:
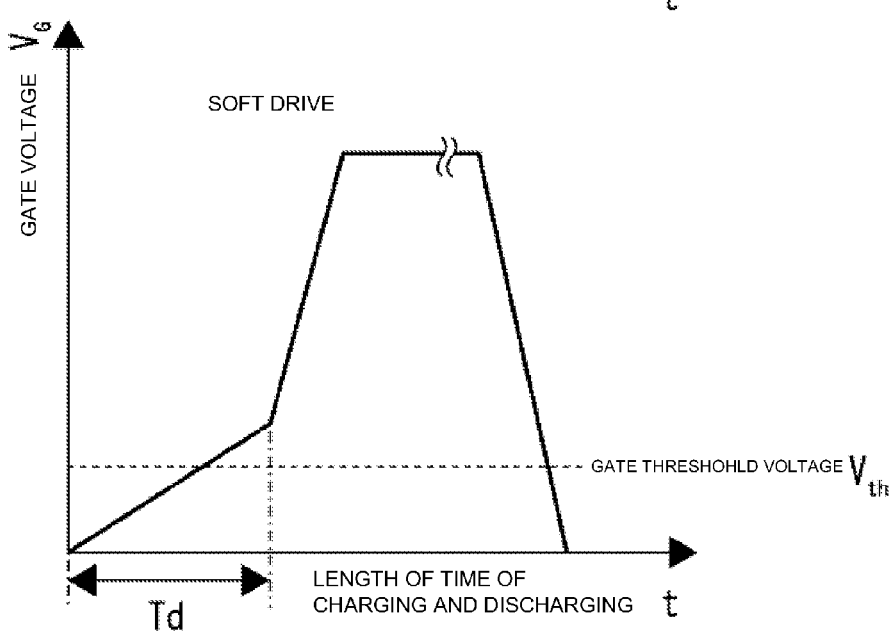

In contrast to this, while soft drive is instructed by the high-level drive switch signal, the output signal from OR circuit OR1 is inputted into second on-switch element 22 via delay circuit 40. Delay circuit 40 is a circuit configured to delay the rise of the output signal from OR circuit OR1. For this reason, once the output signal from OR circuit OR1 turns to the high level, first of all, only first on-switch element 21 is turned on, and as illustrated in FIG. 4B, the gate of switching element Q1 is charged via only first on-drive resistor 31. After a lapse of delay time Td set in delay circuit 40, second on-switch element 22 is turned on, and the gate of switching element Q1 is charged via first on-drive resistor 31 and second on-drive resistor 32 which are connected together in parallel. Incidentally, once the output signal from OR circuit OR1 turns to the high level, first off-switch element 23 is turned off, and the output from OR circuit 42 also turns to the high level; and the high-level output from OR circuit 42 makes second off-switch element 24 turned off as well. Delay time Td set in delay circuit 40 is set at length of time beyond which as illustrated in FIG. 4B, gate voltage $V_G$ of switching element Q1 which is charged via only first on-drive resistor 31 is greater than gate threshold voltage $V_{th}$. For this reason, the soft drive is achieved such that: when the soft drive is instructed, the resistance value of the on-drive resistance is switched to a larger one; the resistance value is held at the large one until gate voltage $V_G$ passes gate threshold voltage $V_{th}$; and thereby, while gate voltage $V_G$ is passing gate threshold voltage $V_{th}$, a speed of charging gate voltage $V_G$ is slower than in the normal drive, and the drive (on the source side) speed is slower than in the normal drive.

While the soft drive is instructed by the high-level drive switch signal, once the output signal from OR circuit OR1 turns to the low level, both first on-switch element 21 and second on-switch element 22 are turned off, first off-switch element 23 is turned on, and the output from OR circuit 42 is kept at the high level. Thus, second off-switch element 24 is kept in an OFF state. Thereby, control is performed such that as illustrated in FIG. 4B, a length of time of discharging the electric charge put into the gate of switching element Q1 is longer than in the normal drive illustrated in FIG. 4A by discharging the electric charge via only first off-drive resistor 33.

Load ratio detection circuit 15 detects a load ratio based on the FB signal which as voltage signal $V_{FB}$, is inputted into the FB/OLP terminal, and determines an output level of the drive switch signal to be outputted to drive circuit 11 and restart delay circuit 16 based on the detected load ratio. As illustrated in FIG. 5, load ratio detection circuit 15 instructs the soft drive by outputting the high-level drive switch signal during activation, overload, and steady load where, however, the load ratio is equal to or less than a pre-set load ratio threshold value. Furthermore, load ratio detection circuit 15 instructs the normal drive by outputting the low-level drive switch signal once during the steady load, the load ratio becomes greater than the load ratio threshold value. It should be noted that load ratio detection circuit 15 may be designed to judge the load ratio based on drain current ID (its peak value) flowing in switching element Q1 which as voltage signal $V_{ocp}$, is inputted into the S/OCP terminal. In addition, load ratio detection circuit 15 may be designed such that during the activation and the overload, load ratio detection circuit 15 detects the load ratio based on the output from comparator COMP1 and the output from comparator COMP2, instead of, as illustrated in FIG. 5, based on the FB signal which as voltage signal $V_{FB}$, is inputted into the FB/OLP terminal.

With the rated load condition taken into consideration, the load ratio is often used as one, which is approximately 60% to 80% of the maximum load condition. The maximum load condition is often set with such a margin as to have a load ratio of approximately 120% of the overcurrent point. In the rated load range, voltage signal $V_{FB}$ and voltage signal $V_{ocp}$ are controlled such that the load ratio can be 40% to 60% of the overcurrent point. In addition, the load ratio threshold value is set at a value which is larger than the 40% to 60% load ratio in the rated load range, for example at 80% as illustrated in FIG. 6A.

Figure 7:
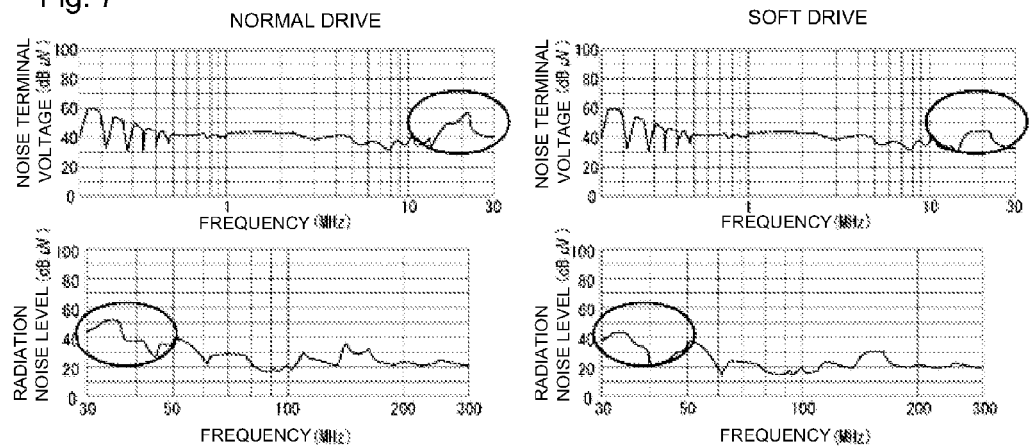
FIG. 7 is a diagram for explaining how an EMI reduction effect is brought about by the soft drive.

Switching element Q1 is less likely to operate in a continuous mode in a range where the load ratio during the steady load is equal to or less than the 80% load ratio threshold value, the range that includes the 40% to 60% as the load ratio in the rated load range. For this reason, the soft drive is employed in order to reduce EMI (Electro-Magnetic Interference) noise, so that the on-drive resistance and the off-drive resistance for the soft drive are larger than those for the normal drive. This decreases the drive speed, that is to say, the speed of charging and discharging the gate of switching element Q1. The employment of the soft drive is an effective measure to counter the EMI noise since. FIG. 7 includes graphs for comparing EMI noise while in the normal drive and EMI noise while in the soft drive. The on-drive resistance for the soft drive (the resistance value of first on-drive resistor 31) is set at several times the on-drive resistance for the normal drive (the aggregate resistance value of first on-drive resistor 31 and second on-drive resistor 32 connected together in parallel). In addition, the off-drive resistance for the soft drive (the resistance value of first off-drive resistor 33) is set at several times the off-drive resistance for the normal drive (the aggregate resistance value of first off-drive resistor 33 and second off-drive resistor 34 connected together in parallel). It is learned from FIG. 7 that the employment of the soft drive largely reduces noise terminal voltage particularly at and around a frequency of 20 MHz, and largely reduces a radiation noise level particularly in a frequency range of 30 MHz to 40 MHz.

Switching element Q1 is more likely to operate in the continuous mode in a range where the load ratio during the steady load is greater than the 80% load ratio threshold value. Once switching element Q1 goes into the continuous mode, turn-on switching loss becomes larger. With this taken into consideration, the load ratio threshold value is set equal to or less than a load ratio at which switching element Q1 operates in the continuous mode during the steady load. In addition, in the range where the load ratio during the steady load is greater than the 80% load ratio threshold value, the normal drive is employed in order to reduce the switching loss, so that the on-drive resistance and the off-drive resistance for the normal drive are made smaller than those for the soft drive. This makes it possible to increase the drive speed, that is to say, the speed of charging and discharging the gate of switching element Q1, and thus to reduce the switching loss.

Although during the activation, the deactivation, and the overload, switching element Q1 operates in the continuous mode, the length of time of the continuous-mode operation is short. For this reason, the soft drive is employed in order to suppress surge voltage generated in rectifier diodes D1, D2, so that the on-drive resistance and the off-drive resistance for the soft drive are larger than those for the normal drive. This makes it possible to decrease the drive speed, that is to say, the speed of charging and discharging the gate of switching element Q1, to thus inhibit turn-on discharge current, and to accordingly suppress the surge voltage generated in the rectifier diodes.

Restart delay circuit 16 is a circuit configured to delay cycles of automatic restart which is performed based on IC power supply voltage Vcc while receiving the high-level drive switch signal from load ratio detection circuit 15. In other words, the invention decreases the number of oscillations (the number of times of repetition of the switching drive operation) by delaying the cycles of automatic restart, and thereby to inhibit the generation of heat by switching element Q1.

Figure 8:
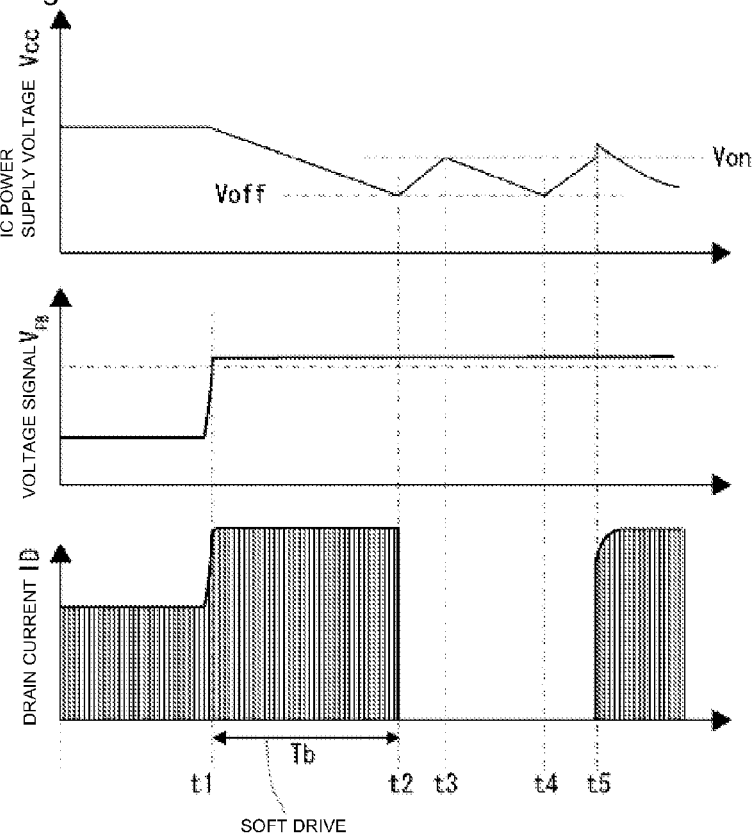
FIG. 8 is a waveform diagram illustrating signal waveforms and operation waveforms, which occur at parts when the controller IC illustrated in FIG. 3 is driven.

As illustrated in FIG. 8, an overload state continues from time t1; and once IC power supply voltage Vcc drops to second reference voltage Voff at time t2, comparator COMP3 outputs the low-level output signal, and controller IC 1 thus stops its operation. After controller IC 1 stops its operation, the activation circuit, albeit not illustrated, charges IC power supply voltage Vcc. Once IC power supply voltage Vcc reaches first reference voltage Von at time t3, comparator COMP3 outputs the high-level output signal. In this respect, restart delay circuit 16 performs control such that the first time that IC power supply voltage Vcc reaches first reference voltage Von, the high-level output signal from comparator COMP3 is outputted to neither regulator 13 nor timer circuit 14. Thereafter, IC power supply voltage Vcc drops to second reference voltage Voff at time t4; and once IC power supply voltage Vcc reaches first reference voltage Von at time t5, restart delay circuit 16 makes the high-level output signal from comparator COMP3 outputted to regulator 13 and timer circuit 14, and thereby activates controller IC 1. In this case, the length of time for one cycle of automatic restart is equal to a length of time obtained by adding: the double of the length of time for which the activation circuit, albeit not illustrated, charges IC power supply voltage Vcc (from second reference voltage Voff to first reference voltage Von); and the length of time for which the IC power supply voltage Vcc is discharged (from first reference voltage Von to second reference voltage Voff). For this reason, the automatic restart after the operation stop due to a continuous overload state (denoted by reference sign Tb in FIG. 8) is delayed by at least two cycles from the normal automatic restart. This makes it possible to decrease the number of oscillations (the number of times of repetition of the switching drive operation), and thereby to inhibit the generation of heat by switching element Q1.

It should be noted that the operation point of the continuous mode may vary to a large extent due to a power supply specification (such as a large-power power supply specification). For this reason, it is desirable that the load ratio threshold value be changeable. The load ratio threshold value may be designed to be changeable, for example, by: providing a load ratio threshold value changing terminal to controller IC 1; and changing a resistor to be connected to the load ratio threshold value changing terminal. Otherwise, a dipswitch configured to change the load ratio threshold value may be provided to controller IC 1.

As described above, the first embodiment is the switched-mode power supply device configured to generate the DC voltage by rectifying the input voltage from the AC power supply, to apply the DC voltage to primary winding P of transformer T, to cause switching element Q1 connected to primary winding P of transformer T to perform the switching operation, to thereby induce the pulse voltage in secondary winding S of transformer T, to obtain output voltage Vo by rectifying and smoothing the pulse voltage using the secondary-side rectifying and smoothing circuit (rectifier diodes D1 and capacitor C2), and to output output voltage Vo to the load. The switched-mode power supply device includes: drive circuit 11 configured to, based on the drive switch signal, cause switching element Q1 to perform the switching operation in either the normal drive in which the speed of charging the gate voltage is faster or the soft drive in which the speed of charging the gate voltage is slower; and load ratio detection circuit 15 configured to output the drive switch signal for instructing the soft drive in the range where the load ratio during the steady load is equal to or less than the load ratio threshold value, and to output the drive switch signal for instructing the normal drive in the range where the load ratio during the steady load is greater than the load ratio threshold value.

This configuration makes it possible for the switched-mode power supply device to switch between the normal drive and the soft drive at appropriate timing in accordance with the load ratio threshold value, and accordingly to drive switching element Q1 optimally over the full load range during the steady load. This makes it possible for the switched-mode power supply device to take the sufficient measure to counter the EMI noise without increasing the switching loss.

In addition, the first embodiment sets the load ratio threshold value equal to or less than the load ratio at which switching element Q1 operates in the continuous mode during the steady load.

This configuration makes it possible for the switched-mode power supply device to take the measure to counter the EMI noise through the soft drive, and to reduce the switching loss through the normal drive in the range where the switched-mode power supply device operates switching element Q1 in the continuous mode.

Furthermore, the first embodiment causes load ratio detection circuit 15 to output the drive switch signal for instructing the soft drive during the activation and the overload.

This configuration makes it possible for the switched-mode power supply device to take the measure to counter the EMI noise during the activation and the overload, and to suppress the surge voltage generated in the rectifier diodes by inhibiting the turn-on discharge current.

Moreover, in drive circuit 11 of the first embodiment, the speed of discharging the gate voltage in the soft drive is set slower than that in the normal drive.

This configuration makes it possible for the switched-mode power supply device to more effectively take the measure to counter the EMI noise.

In addition, the first embodiment makes the load ratio threshold value changeable.

This configuration makes it possible for the switched-mode power supply device to switch between the normal drive and the soft drive even if the operation point of the continuous mode varies to a large extent due to the power supply specification.

(Second Embodiment)

Figure 9:
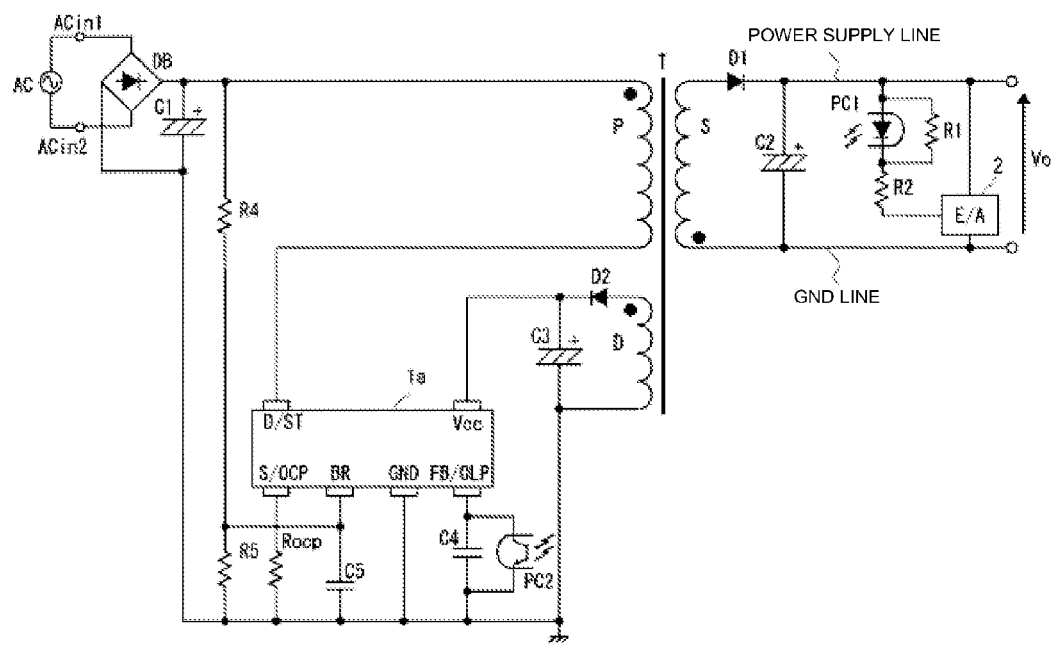
FIG. 9 illustrates a circuit configuration of a second embodiment of the switched-mode power supply device.
Figure 10:
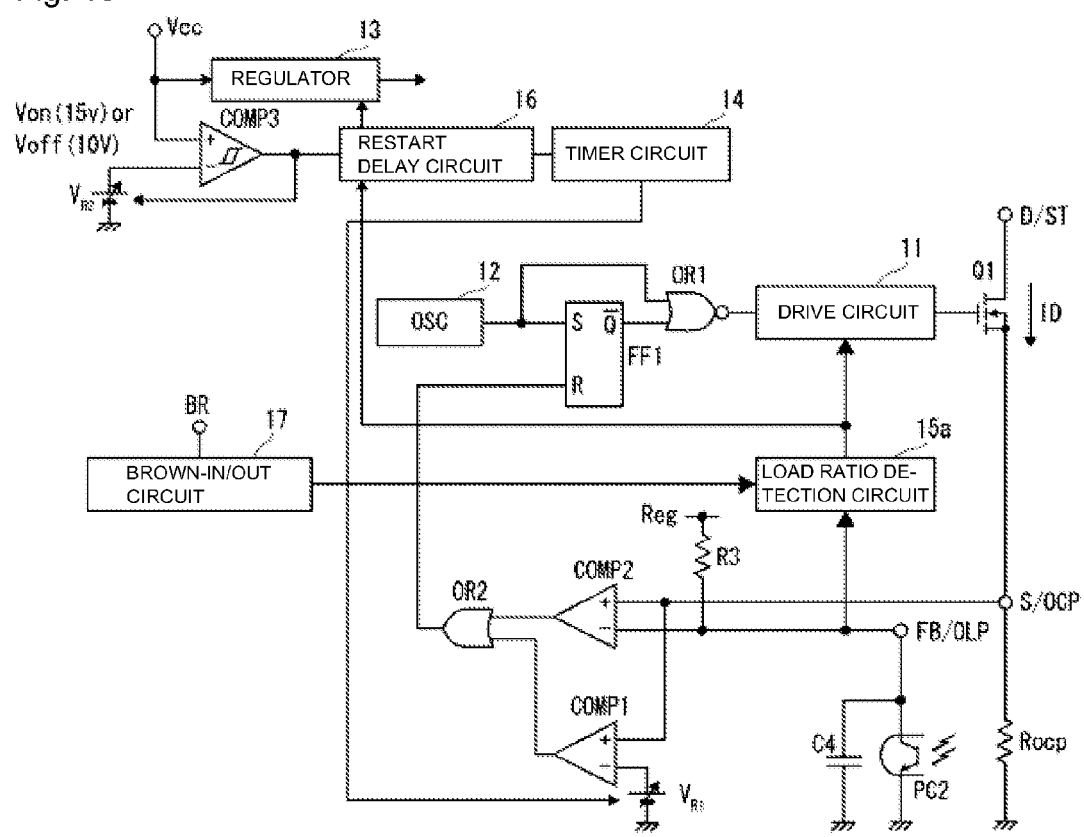
FIG. 10 illustrates a circuit configuration of a controller IC illustrated in FIG. 9.

Referring to FIG. 9, controller IC 1a of a second embodiment includes a BR (brown-in/out) terminal in addition to the configuration of controller IC 1 of the first embodiment. As voltage-dividing resistors, resistor R4 and resistor R5 are connected in series between the rectified output positive terminal of rectifier circuit DB and the ground terminal. Furthermore, the connection point between resistor R4 and resistor R5 is connected to the BR terminal of controller IC 1a. Capacitor C5 configured to remove high-frequency noise is connected between the BR terminal and the ground terminal. Thereby, a voltage in proportion to the DC voltage outputted from rectifier circuit DB is inputted into the BR terminal. Controller IC 1a performs a brown-in and brown-out function of: monitoring a voltage from commercial AC power supply AC (hereinafter referred to as an input voltage) based on a voltage at the BR terminal; and preventing excessive input current and overheating by stopping the switching operation when the input voltage is low.

Based on the voltage at the BR terminal, brown-in/out circuit 17 judges whether the input voltage from commercial AC power supply AC is of the AC 100V system or the AC 200V system, and informs load ratio detection circuit 15a of a result of the judgment. It should be noted that: when the input voltage from commercial AC power supply AC is in a range of approximately AC 85V to AC 130V, brown-in/out circuit 17 of this embodiment judges that the input voltage is of the AC 100V system; and when the input voltage from commercial AC power supply AC is in a range of approximately AC 180V to AC 265V, brown-in/out circuit 17 of this embodiment judges that the input voltage is of the AC 200V system.

Load ratio detection circuit 15a detects the load ratio based on the FB signal which as voltage signal $V_{FB}$, is inputted into FB/OLP terminal, and determines the output level of the drive switch signal to be outputted to drive circuit 11 and restart delay circuit 16 based on the result of the judgment on the input voltage and the detected load ratio. If the input voltage is of the AC 100V system, as illustrated in FIG. 6B, load ratio detection circuit 15a instructs the soft drive by outputting the high-level drive switch signal during the activation, the overload, and the steady load where, however, the load ratio is equal to or less than the load ratio threshold value (for example, 80%), and instructs the normal drive by outputting the low-level drive switch signal once during the steady load, the load ratio becomes greater than the load ratio threshold value. Furthermore, if the input voltage is of the AC 200V system, as illustrated in FIG. 6B, load ratio detection circuit 15a instructs the soft drive over the full load range by outputting the high-level drive switch signal. In other words, when the input voltage is of the AC 100V system, switching element Q1 is more likely to operate in the continuous mode during the overload where the load ratio is greater than the load ratio threshold value (for example, 80%). For this reason, with the switching loss taken into consideration, the switched-mode power supply device causes switching element Q1 to perform the switching operation in the normal drive. In contrast, when the input voltage is of the AC 200V system, switching element Q1 is less likely to operate in the continuous mode during the overload where the load ratio is greater than the load ratio threshold value (for example, 80%). For this reason, with the measure to counter the EMI noise and the surge voltage generated in the rectifier diodes, rather than the switching loss, taken into consideration, the switched-mode power supply device causes switching element Q1 to perform the switching operation in the soft drive. It should be noted that since the AC 200V system where the input voltage is higher makes the turn-on discharge current larger, the EMI noise, and the surge voltage generated in the rectifier diodes tend to become larger.

It should be noted that load ratio detection circuit 15a may be designed such that: AC 100V load ratio threshold value Xa, and AC 200V load ratio threshold value Xb which is larger than AC 100V load ratio threshold value Xa are set in load ratio detection circuit 15a; as illustrated in FIG. 6C, if the input voltage is of the AC 100V system, load ratio detection circuit 15a instructs the normal drive by outputting the low-level drive switch signal once during the steady load, the load ratio becomes larger than AC 100V load ratio threshold value Xa; and as illustrated in FIG. 6C, if the input voltage is of the AC 200V system, load ratio detection circuit 15a instructs the normal drive by outputting the low-level drive switch signal once during the steady load, the load ratio becomes larger than AC 200V load ratio threshold value Xb.

Furthermore, the second embodiment is designed to judge whether the input voltage from commercial AC power supply AC is of the AC 100V system or the AC 200V system by detecting the DC voltage generated by rectifying the input voltage using rectifier circuit DB. Instead, the second embodiment may be designed to judge whether the input voltage from commercial AC power supply AC is of the AC 100V system or the AC 200V system by directly detecting the input voltage from commercial AC power supply AC, by detecting a voltage at an activation terminal, or by detecting a voltage at a forward voltage detection terminal.

As described above, the second embodiment is the switched-mode power supply device configured to generate the DC voltage by rectifying the input voltage from the AC power supply, to apply the DC voltage to primary winding P of transformer T, to cause switching element Q1 connected to primary winding P of transformer T to perform the switching operation, to thereby induce the pulse voltage in secondary winding S of transformer T, to obtain output voltage Vo by rectifying and smoothing the pulse voltage using the secondary-side rectifying and smoothing circuit (rectifier diodes D1 and capacitor C2), and to output output voltage Vo to the load. The switched-mode power supply device includes: drive circuit 11 configured to, on the basis of the drive switch signal, cause switching element Q1 to perform the switching operation in either the normal drive in which the speed of charging the gate voltage is faster or the soft drive in which the speed of charging the gate voltage is slower; and load ratio detection circuit 15a configured to output the drive switch signal for instructing the soft drive in the range where the load ratio during the steady load is equal to or less than the load ratio threshold value, and to output the drive switch signal for instructing the normal drive in the range where the load ratio during the steady load is greater than the load ratio threshold value. The switched-mode power supply device further includes brown-in/out circuit 17 configured to judge whether the input voltage from the AC power supply is of the AC 100V system or the AC 200V system. If the input voltage is of the AC 200V system, load ratio detection circuit 15a outputs the drive switch signal for instructing the soft drive even in the range where the load ratio during the steady load is greater than the load ratio threshold value.

When the input voltage is of the AC 200V system, switching element Q1 is less likely to operate in the continuous mode during the overload where the load ratio is greater than the load ratio threshold value (for example, 80%). For this reason, the foregoing configuration makes it possible for the switched-mode power supply device to cause switching element Q1 to perform the switching operation in the soft drive with the measure to counter the EMI noise and the surge voltage generated in the rectifier diodes, rather than the switching loss, taken into consideration.

Moreover, the second embodiment may design load ratio detection circuit 15a such that: when the input voltage is of the AC 200V system, load ratio detection circuit 15a outputs the drive switch signal for instructing the soft drive in the range where the load ratio during the steady load is equal to or less than AC 200V load ratio threshold value Xb which is larger than AC 100V load ratio threshold value Xa, and outputs the drive switch signal for instructing the normal drive in the range where the load ratio during the steady load is greater than AC 200V load ratio threshold value Xb.

This configuration makes it possible to set the timing of switching between the normal drive and the soft drive for each of the AC 100V system and the AC 200V system. For this reason, the switched-mode power supply device is capable of switching between the two drives at more appropriate timing depending on the input voltage.

(Third Embodiment)

Figure 11:
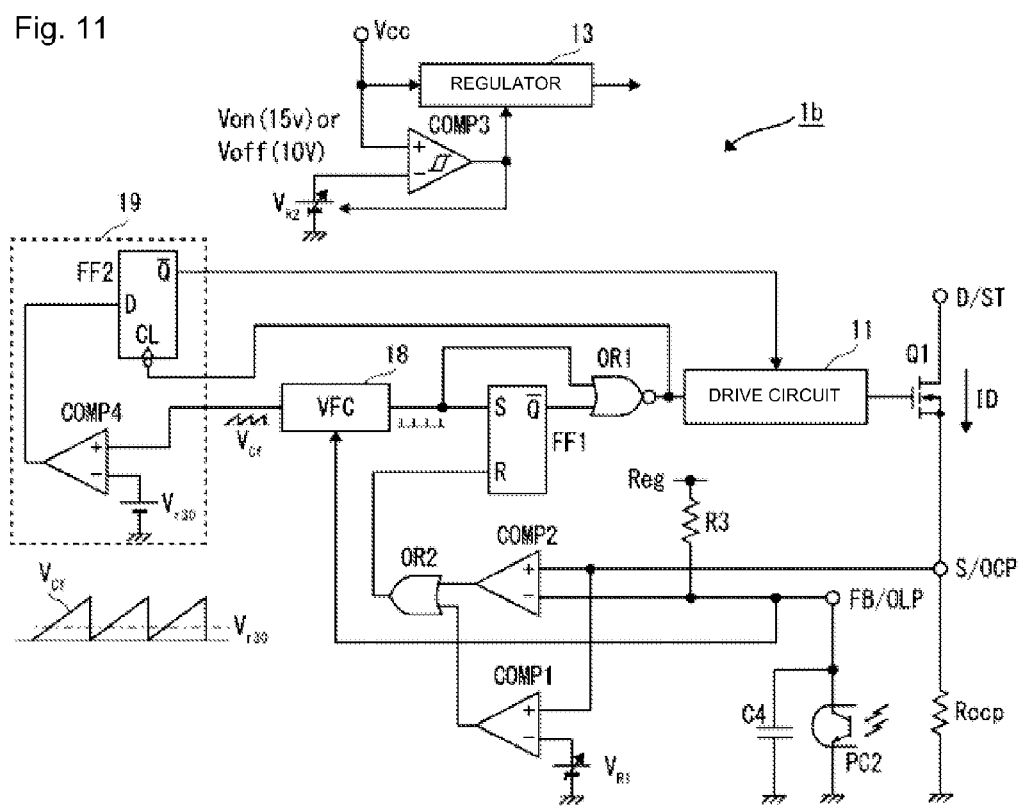
FIG. 11 illustrates a circuit configuration of a third embodiment of the controller IC in the switched-mode power supply device.

Referring to FIG. 11, controller IC 1b of a third embodiment includes VFC (pulse converter) 18 instead of OSC 12 of the first embodiment. Controller IC 1b further includes drive switch circuit 19 configured to output the drive switch signal in accordance with an ON duty of switching element Q1 (a percentage of the ON duty in a duty ratio controlled by feedback control).

VFC 18 outputs a clock signal to the S terminal of flip flop FF1 and one of the input terminals of OR circuit OR1 at a frequency based on the FB signal which as voltage signal $V_{FB}$, is inputted into the FB/OLP terminal. Like the pulse width of the clock signal outputted from OSC 12, the pulse width of the clock signal from VFC 18 is set less than the minimum ON time width of switching element Q1. Thereby, control is performed to reduce the switching frequency of turning on and off switching element Q1 in accordance with the load.

In addition, VFC 18 generates sawtooth wave $V_{Cf}$ whose frequency is equal to that of the clock signal, and outputs sawtooth wave $V_{Cf}$ to drive switch circuit 19. Sawtooth wave $V_{Cf}$ rises from the lowest voltage to the highest voltage for each interval between timings when a pulse of the clock signal is outputted, and quickly drops at timing when a pulse of the clock signal is outputted. It should be noted that: no matter how the frequency of the clock signal is changed, the highest voltage of sawtooth wave $V_{Cf}$ remains unchanged; and the gradient of the rise of sawtooth wave $V_{Cf}$ is accordingly changed.

Drive switch circuit 19 is formed from comparator COMP4 and flip flop FF2. Comparator COMP4 is a comparator circuit configured to compare sawtooth wave $V_{Cf}$ and reference voltage $V_{r30}$. The non-inverting input terminal of comparator COMP4 is connected to the output terminal of VFC 18 through which sawtooth wave $V_{Cf}$ is outputted, while the inverting input terminal of comparator COMP4 is connected to reference voltage $V_{r30}$. Reference voltage $V_{r30}$ functions as a duty threshold value with which to compare the ON duty of switching element Q1. This embodiment sets reference voltage $V_{r30}$ at a voltage, which is 30% of the highest voltage of sawtooth wave $V_{Cf}$.

Flip-flop FF2 is an edge-triggered D flip-flop configured to operate in response to a negative trigger. Output from comparator COMP4 is inputted into the D terminal of flip flop FF2, and the output from OR circuit OR1 is inputted into the CL terminal of flip-flop FF2. The drive switch signal is outputted from inverting output terminal Q⁻ of flip-flop FF2 to drive circuit 11.

Figure 12:
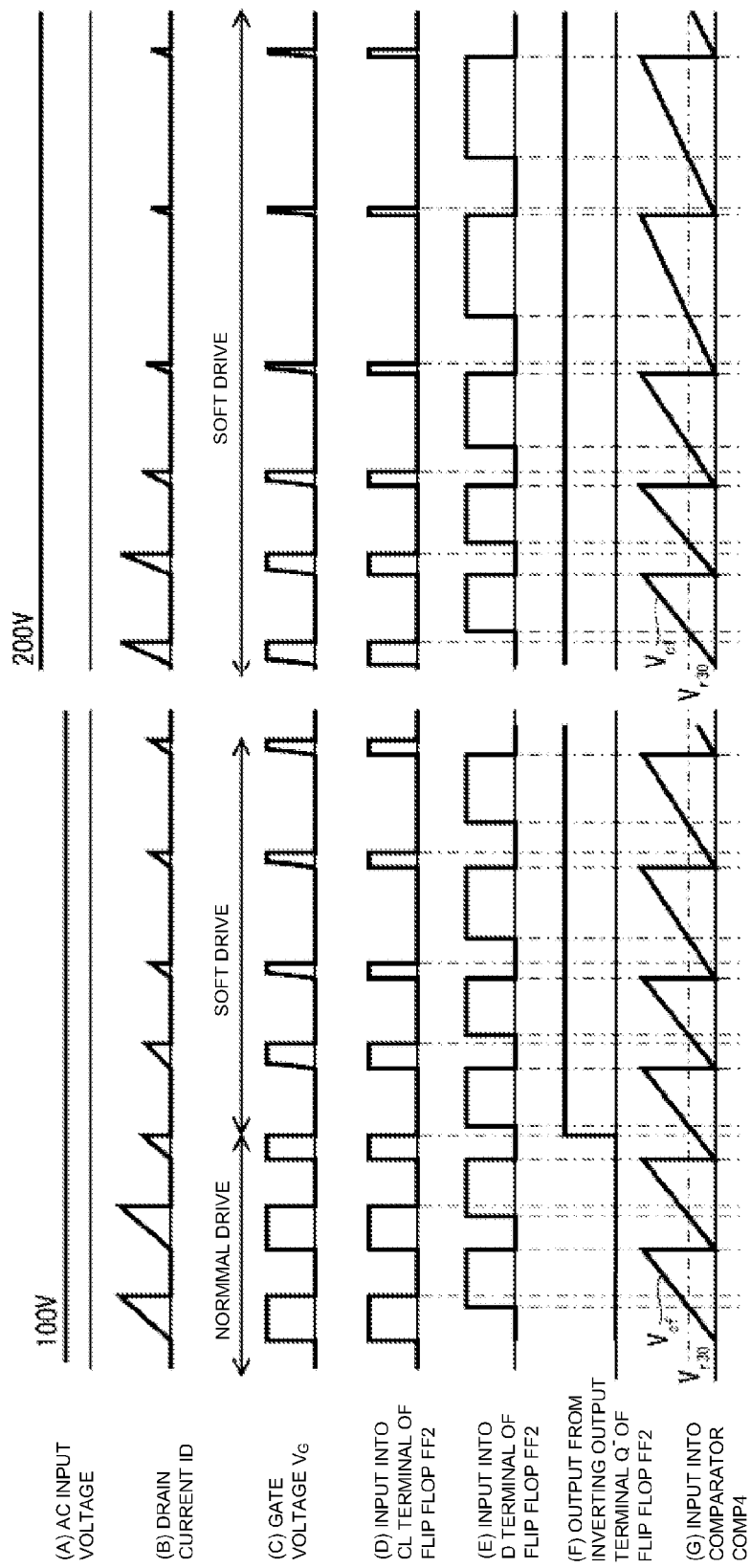
FIG. 12 is a waveform diagram illustrating signal waveforms and operation waveforms, which occur at parts illustrated in FIG. 11.

Next, referring to FIG. 12, detailed descriptions are provided for how drive switch circuit 19 works. In order from top to bottom, FIG. 12 illustrates (A) the input voltage, (B) drain current ID flowing in switching element Q1, (C) gate voltage $V_G$ for driving switching element Q1, (D) the input into the CL terminal of flip flop FF2, (E) the input into the D terminal of flip flop FF2, (F) the output from inverting output terminal Q⁻ of flip flop FF2, and (G) the input into comparator COMP4.

Comparator COMP4 compares sawtooth wave $V_{Cf}$ and reference voltage $V_{r30}$, as illustrated in FIG. 12G. Thereby, comparator COMP4 generates a signal waveform, as illustrated in FIG. 12E, which is at the low level while sawtooth wave $V_{Cf}$ is less than reference voltage $V_{r30}$, and which is at the high level while sawtooth wave $V_{Cf}$ is equal to or greater than reference voltage $V_{r30}$. Comparator COMP4 outputs the signal waveform to the D terminal of flip-flop FF2. The timing when the waveform of sawtooth wave $V_{Cf}$ starts to rise (the timing when the waveform of sawtooth wave $V_{Cf}$ drops) is in synchronism with the timing when switching element Q1 turns on. For this reason, no matter how the switching frequency is changed, the input into the D terminal of flip flop FF2 takes on a waveform which drops each time switching element Q1 turns on, and which rises in response to the predetermined duty threshold value (a ratio) determined by reference voltage $V_{r30}$.

The output signal from OR circuit OR1, which is illustrated in FIG. 12D, is inputted into the CL terminal of flip-flop FF2. Thereby, flip flop FF2 outputs a signal waveform, as illustrated in FIG. 12F, which indicates that: if the input into the D terminal of flip flop FF2 is at the high level at the timing when the input into the CL terminal of flip flop FF2 rises, flip flop FF2 is set, that is to say, the output from inverting output terminal Q⁻ of flip flop FF2 turns to the low level; and if the input into the D terminal of flip flop FF2 is at the low level at the timing when the input into the CL terminal of flip flop FF2 drops, flip flop FF2 is reset, that is to say, the output from inverting output terminal Q⁻ of flip flop FF2 turns to the high level. The output from inverting output terminal Q⁻ of flip-flop FF2 functions as the drive switch signal. The output signal from OR circuit OR1 is in synchronism with gate voltage $V_G$ which is illustrated in FIG. 12C. For these reasons, the timing when the input into the CL terminal rises is in synchronism with the timing when switching element Q1 turns off. Accordingly, if the ON duty of switching element Q1 is less than the duty threshold value, flip flop FF2 outputs the high-level drive switch signal, that is to say, the drive switch signal for instructing the soft drive, to drive circuit 11. In contrast, if the ON duty of switching element Q1 is equal to or greater than the duty threshold value, flip flop FF2 outputs the low-level drive switch signal, that is to say, the drive switch signal for instructing the normal drive, to drive circuit 11.

Figure 13:
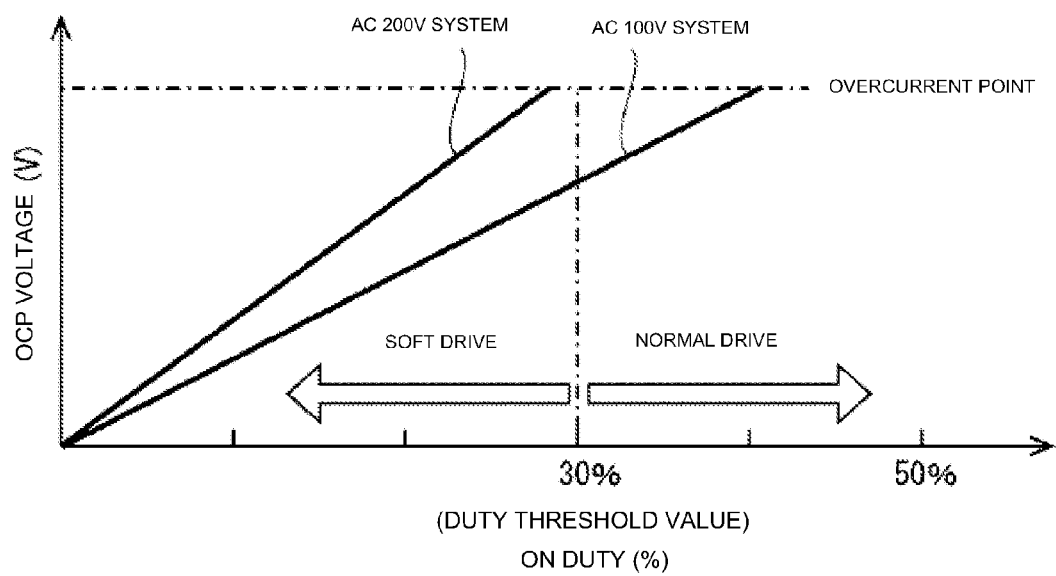
FIG. 13 is a diagram for explaining how drive switch timing is set in accordance with ON duty.

This embodiment sets the duty threshold value (30% in the embodiment) greater than the maximum ON duty up to which switching element Q1 can operate when the input voltage is of the AC 200V system, and less than the maximum ON duty up to which switching element Q1 can operate when the input voltage is of the AC 100V system. FIG. 13 is a graph illustrating a relationship between an OCP voltage (V), which is a peak of voltage signal $V_{ocp}$, and the ON duty (%), for each of the case where the input voltage is of the AC 100V system, and the case where the input voltage is of the AC 200V system.

In the case where the input voltage is of the AC 100V system, the ON duty is less than the duty threshold value in the load range where the load ratio is less than approximately 80%, including the light load range, and is equal to or greater than the duty threshold value in the load range where the load ratio is greater than approximately 80%, including the overcurrent point. For this reason, the heat generation by the controller IC due to the switching loss can be inhibited by driving switching element Q1 in the normal-drive mode before in the continuous mode. In addition, in the load range where the load ratio is less than approximately 80%, including the light load range, the effect of reducing the EMI noise can be obtained by driving switching element Q1 in the soft drive.

In the case where the input voltage is of the AC 200V system, the ON duty is less than the duty threshold value over the full load range including the overload point. For this reason, switching element Q1 performs the switching operation in the soft drive over the full load range, and the EMI noise can be accordingly suppressed over the full load range. Furthermore, the turn-on discharge current can be suppressed as well, and the voltage (VRM) applied to rectifier diode D1 in the output line can be suppressed over the full load range. These make it possible to suppress the breakdown voltage of diode D1, and to replace the fast-recovery diode (FRD) with a Schottky barrier diode (SBD) or the like. This leads to the suppression of the forward voltage of the diode, a reduction in the switching loss and heat generation, and accordingly an improvement to the efficiency. One may consider that even if the switching loss slightly increases by the on-drive resistance, which is set larger for the case where the input voltage is of the AC 200V system, an influence of the slight increase in the switching loss is mitigated by the frequency reduction function. In addition, in the case where the input voltage is of the AC 200V system, there is a risk that controller IC 1 generates heat due to the overload state, which occurs while in the soft drive, which makes the drive speed lower. For this reason, automatic restart control may be employed by providing restart delay circuit 16.

As described above, the third embodiment is the switched-mode power supply device configured to generate the DC voltage by rectifying the input voltage from the AC power supply, to apply the DC voltage to primary winding P of transformer T, to cause switching element Q1 connected to primary winding P of transformer T to perform the switching operation, to thereby induce the pulse voltage in secondary winding S of transformer T, to obtain output voltage Vo by rectifying and smoothing the pulse voltage using the secondary-side rectifying and smoothing circuit (rectifier diodes D1 and capacitor C2), and to output output voltage Vo to the load. The switched-mode power supply device includes: drive circuit 11 configured to, on the basis of the drive switch signal, cause switching element Q1 to perform the switching operation in either the normal drive in which the speed of charging the gate voltage is faster or the soft drive in which the speed of charging the gate voltage is slower; and drive switch circuit 19 configured to output the drive switch signal for instructing the soft drive if the ON duty of switching element Q1 is less than the pre-set duty threshold value, and to output the drive switch signal for instructing the normal drive if the ON duty of switching element Q1 is equal to or greater than the duty threshold value.

This configuration makes it possible for the switched-mode power supply device to switch between the normal drive and the soft drive at appropriate timing in accordance with the ON duty, and accordingly to drive switching element Q1 optimally over the full load range during the steady load. This makes it possible for switched-mode power supply device to take the sufficient measure to counter the EMI noise without increasing the switching loss.

Furthermore, for each input voltage, the switched-mode power supply device is capable of switching between the normal drive and the soft drive at appropriate timing, since the ON duty differs from one input voltage to anther even if the duty ratio is the same among the input voltages.

Moreover, the third embodiment sets the duty threshold value greater than the maximum ON duty up to which switching element Q1 can operate when the input voltage is of the AC 200V system, and less than the maximum. ON duty up to which switching element Q1 can operate when the input voltage is of the AC 100V system.

Switched-mode power supply devices of the related art differ from one another in pulse width (ON time) and device temperature, depending on their power supply specifications and environmental conditions. For this reason, there are cases where the gate resistance cannot be switched at appropriate timing even though the pulse width and the temperature can be detected as expected by the related art. If the timing of increasing the gate resistance is too early, the turn-on switching loss increases. If the timing of increasing the gate resistance is too late, the measure to counter the EMI noise becomes insufficient.

Another switched-mode power supply device of an embodiment may comprise a detector. The detector receives DC voltage that was rectified by rectifier circuit DB, and outputs a high-level drive switch signal when low DC voltage is detected. Then, drive circuit 11 receives the high-level drive switch signal and cause switching element Q1 to perform the switching operation in the soft drive in which the speed of charging the gate voltage is slower.

The switched-mode power supply device of each embodiment described above is capable of: switching between the normal drive and the soft drive at appropriate timing; thus driving switching element Q1 optimally over the full load range during the steady load; and accordingly taking the sufficient measure to counter the EMI noise without increasing the switching loss.

The configurations, shapes, sizes and arrangement relationships described in the foregoing embodiments are just schematically illustrated to an extent that the invention can be understood and carried out. In addition, the numerical values, components (materials) in each configuration, and the like are illustrated just as examples. Accordingly, the invention is not limited to the above-described embodiments, and may be modified in various modes as long as the modification does not depart from the scope of the technical ideas shown in the scope of claims.

The invention claimed is:

1. A switched-mode power supply device comprising:
an AC power supply;
a transformer comprising
a primary winding to which a DC voltage is applied, the DC voltage generated by rectifying an input voltage from the AC power supply, and
a secondary winding that induces a pulse voltage based on operation of a switching element, the switching element electrically connected to the primary winding;
a secondary-side rectifying and smoothing circuit that generates an output voltage by rectifying and smoothing the pulse voltage;
a load ratio detection circuit that detects if a load ratio is not greater than a load ratio threshold value during steady load, and outputs a drive switch signal based on the detection;
a drive circuit that, on the basis of the drive switch signal, causes the switching element to perform switching operation in one of a normal drive in which a speed of charging a gate voltage is faster than a speed of charging the gate voltage in a soft drive in which the speed of charging the gate voltage is slower than the speed of charging the gate voltage in the normal drive; and
an input voltage detection circuit that detects if the input voltage from the AC power supply is of an AC 100V system or an AC 200V system, wherein
in a condition in which the detected input voltage from the AC power supply is of the AC 200V system, the load ratio detection circuit outputs the drive switch signal for instructing the soft drive in a range where the load ratio during the steady load is greater than the load ratio threshold value.

2. The switched-mode power supply device of claim 1, wherein the load ratio threshold value is set equal to or less than a load ratio at which the switching element operates in a continuous mode during the steady load.

3. The switched-mode power supply device of claim 1, wherein the load ratio detection circuit outputs the drive switch signal for instructing the soft drive during activation and overload.

4. The switched-mode power supply device of claim 1, wherein the load ratio threshold value is changeable.

5. A switched-mode power supply device comprising:
an AC power supply;
a transformer comprising
a primary winding to which a DC voltage is applied, the DC voltage generated by rectifying an input voltage from the AC power supply, and a secondary winding that induces a pulse voltage based on operation of a switching element, the switching element electrically connected to the primary winding;

a secondary-side rectifying and smoothing circuit that generates an output voltage by rectifying and smoothing the pulse voltage;

a load ratio detection circuit that detects if a load ratio is not greater than a load ratio threshold value during steady load, and outputs a drive switch signal based on the detection; and a drive circuit that, on the basis of the drive switch signal, causes the switching element to perform switching operation in one of a normal drive in which a speed of charging a gate voltage is faster than a speed of charging the gate voltage in a soft drive in which the speed of charging the gate voltage is slower than the speed of charging the gate voltage in the normal drive; and an input voltage detection circuit that detects if the input voltage from the AC power supply is of an AC 100V system or an AC 200V system, wherein in a condition in which the detected input voltage from the AC power supply is of the AC 200V system, the load ratio detection circuit outputs the drive switch signal for instructing the soft drive in a range where the load ratio during the steady load is equal to or less than an AC 200V load ratio threshold value which is larger than the load ratio threshold value, and outputs the drive switch signal for instructing the normal drive in a range where the load ratio during the steady load is greater than the AC 200V load ratio threshold value.

6. The switched-mode power supply device of claim 5, wherein the load ratio threshold value is set equal to or less than a load ratio at which the switching element operates in a continuous mode during the steady load.

7. The switched-mode power supply device of claim 5, wherein the load ratio detection circuit outputs the drive switch signal for instructing the soft drive during activation and overload.

8. The switched-mode power supply device of claim 5, wherein the load ratio threshold value is changeable.

9. A switched-mode power supply device comprising:

an AC power supply;

a transformer comprising a primary winding to which a DC voltage is applied, the DC voltage generated by rectifying an input voltage from the AC power supply, and a secondary winding that induces a pulse voltage based on operation of a switching element;

the switching element electrically connected to the primary winding;

a secondary-side rectifying and smoothing circuit that generates an output voltage by rectifying and smoothing the pulse voltage;

a drive circuit that, on the basis of a drive switch signal, cause the switching element to perform switching operation in one of a normal drive in which a speed of charging a gate voltage is faster than a speed of charging the gate voltage in a soft drive in which the speed of charging the gate voltage is slower than the speed of charging the gate voltage in the normal drive; and a drive switch circuit that outputs the drive switch signal for instructing the soft drive if an ON duty of the switching element is less than a pre-set duty threshold value, and outputs the drive switch signal for instructing the normal drive if the ON duty of the switching element is equal to or greater than the duty threshold value wherein the duty threshold value is set greater than a maximum ON duty up to which the switching element is operable when the input voltage is of an AC 200V system, and less than a maximum ON duty up to which the switching element is operable when the input voltage is of an AC 100V system.

* * * * *